United States Patent
Hung et al.

(10) Patent No.: US 9,641,194 B2
(45) Date of Patent: May 2, 2017

(54) METHOD FOR ENCODING MULTI-MODE OF BCH CODES AND ENCODER THEREOF

(71) Applicant: Storart Technology Co., Ltd., Hsinchu (TW)

(72) Inventors: Jui Hui Hung, Hsinchu (TW); Chih Nan Yen, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 48 days.

(21) Appl. No.: 14/288,904

(22) Filed: May 28, 2014

(65) Prior Publication Data
US 2015/0349804 A1    Dec. 3, 2015

(51) Int. Cl.
*H03M 13/00* (2006.01)
*H03M 13/15* (2006.01)

(52) U.S. Cl.
CPC ....... *H03M 13/152* (2013.01); *H03M 13/611* (2013.01); *H03M 13/616* (2013.01); *H03M 13/6516* (2013.01)

(58) Field of Classification Search
CPC .......... H03M 13/152; H03M 13/6516; H03M 13/611; H03M 13/616
See application file for complete search history.

(56) References Cited

U.S. PATENT DOCUMENTS

2008/0163026 A1*  7/2008  Varnica .............. G06F 11/1008
                                                                714/755
2011/0246862 A1* 10/2011  Graef ................ H03M 13/1108
                                                                714/785

* cited by examiner

*Primary Examiner* — Guy Lamarre
(74) *Attorney, Agent, or Firm* — Che-Yang Chen; Law Offices of Scott Warmuth

(57) ABSTRACT

A method for encoding multi-modes of BCH codes and an associated encoder is disclosed. The method has the steps of: building a number of encoding matrices; combining the encoding matrices with one side aligned to form a combined matrix; seeking common sub-expressions (CSEs) in the combined matrix, and encoding a message using the combined matrix.

10 Claims, 7 Drawing Sheets

METHOD FOR ENCODING MULTI-MODE OF BCH CODES AND ENCODER THEREOF

FIELD OF THE INVENTION

The present invention relates to an encoder. More particularly, the present invention relates to a multi-mode encoder for different BCH codes with any codelength, coderate or a number over $GF(2^m)$.

BACKGROUND OF THE INVENTION

Bose-Chaudhuri-Hocquenghem (BCH) code is one of the most widely used error correction code (ECC) techniques in the storage and communication devices. BCH code can detect and correct random errors occurred due to channel noises and defects within memory devices. The encoding procedures of BCH codeword can be implemented by linear feedback shift register (LFSR) and some combination logics together. A conventional linear feedback shift register circuit is shown in FIG. 1. In order to speed up operation, the circuit is often designed to be parallelization. It can calculate several inputted bit datum at the same time. The alphabet p in FIG. 1 represents the p-bit datum of the inputted R'(j) in the $j^{th}$ clock cycle for synchronized calculation. After encoding, the results of Z(j) are outputted. If the code length is n bits, the procedures of encoding will complete after [n/p] clock cycles.

A detailed illustration about BCH encoding is provided below. For an encoded BCH codeword having n bits, it includes a k-bit message. During encoding processes, a generating polynomial below is applied:

$$g(x) = x^R + g'_{R-1}x^{R-1} + g'_{R-2}x^{R-2} + \ldots + g'_2x^2 + g'_1x^1 + g'_0,$$

where R=n−k+1. When an encoder capable of processing encoding of p parallel computations synchronously is used, for a n-bit initial processing data including the k-bit message and being divided per p bits as R'(1), R'(2), . . . R'(n/p) (R'(n/p) is not necessary p bits), and inputted to the encoder per clock cycle sequentially for operation. In view of a general formula, in a $j^{th}$ clock cycle ($1 \leq j \leq n/p$), the outputted computed values are as: $Z(j) = F^p \times [Z(j-1) + R'(j)]$. It should be noticed that all elements in Z(0) are 0. In order to facilitate operation, it is denoted that $$R'(j) = [r'_0(j)r'_1(j)r'_2(j) \ldots r'_{p-1}(j)|0 \ldots 0]_{1 \times R}^T.$$

R'(j) is the $j^{th}$ p bits. Z(j) has R bits denoting by $Z_0(j)$, $Z_1(j)$, . . . $Z_{R-1}(j)$, respectively. Other expressions in the above formula are further described as below:

$$F^p = \begin{bmatrix} F^{p-1} \times \begin{bmatrix} g'_{R-1} \\ g'_{R-2} \\ \vdots \\ g'_1 \\ g'_0 \end{bmatrix} & \text{first } R-1 \text{ columns of } F^{p-1} \end{bmatrix}$$

$$F^1 = \begin{bmatrix} g'_{R-1} & 1 & 0 & \ldots & 0 \\ g'_{R-2} & 0 & 1 & \ldots & 0 \\ \vdots & \vdots & \vdots & \vdots & \vdots \\ g'_1 & 0 & 0 & \ldots & 1 \\ g'_0 & 0 & 0 & \ldots & 0 \end{bmatrix},$$

Let F'=[first p columns of $F^p|F^p$], transpose of Z(j) can be obtained.

$$Z(j)^T = \{F^p \times [Z(j-1) + R'(j)]\}^T$$
$$= [Z(j-1) + R'(j)]^T \times F^{p^T}$$
$$= [R'(j)Z(j-1)] \times F'^T$$

A circuit fulfills this operation can also achieve the encoding operation shown in FIG. 1. An encoded codeword is obtained in [n/p] clock cycles The pervious method can only be used for a fixed code rate and code length in the same $GF(2^m)$. For some applications, various code lengths, code rates, number of m in the $GF(2^m)$, and the values of the parallel parameter p may be required. Conventionally, those requirements can be implemented with specified BCH encoders. Thus, the hardware complexity will increase. To reduce the hardware complexity, some designers may insert a lot of multiplexers into the LFSR to share registers. However, the additional area and delay time due to those multiplexer insertions will harm the benefit.

Hence, a proposed method used to share one LFSR for various BCH codes and associated encoder is desired. Moreover, the method can enlarge searching space of common sub-expressions (CSEs) in one matrix to reduce the hardware logic area.

SUMMARY OF THE INVENTION

According to an aspect of the present invention, a method for encoding multi-modes of BCH codes includes the step of: building a number of encoding matrices; combining the encoding matrices with one side aligned to form a combined matrix; seeking common sub-expressions (CSEs) in the combined matrix, and encoding a message using the combined matrix. Each of the encoding matrix has a form of $$F^p = \begin{bmatrix} F^{p-1} \times \begin{bmatrix} g'_{R-1} \\ g'_{R-2} \\ \vdots \\ g'_1 \\ g'_0 \end{bmatrix} & \text{first } R-1 \text{ columns of } F^{p-1} \end{bmatrix}, \text{ where}$$

$$F^1 = \begin{bmatrix} g'_{R-1} & 1 & 0 & \ldots & 0 \\ g'_{R-2} & 0 & 1 & \ldots & 0 \\ \vdots & \vdots & \vdots & \vdots & \vdots \\ g'_1 & 0 & 0 & \ldots & 1 \\ g'_0 & 0 & 0 & \ldots & 0 \end{bmatrix},$$

For an n-bit initial processing data including a k-bit message and being divided per p bits, R is defined as R=n−k+1. $g'_{R-1}$, $g'_{R-2}$, . . . and $g'_0$ are coefficients of a generating polynomial, $g(x) = x^R + g'_{R-1}x^{R-1} + g'_{R-2}x^{R-2} + \ldots + g'_2x^2 + g'_1x^1 + g'_0$. Any two encoding matrices have the same or different values of n and/or k.

Preferably, space in the combined matrix which is not filled by elements of the encoding matrices is filled with 0. One side of the combined matrix has encoding matrices arranged in sequence. At least one encoding matrix in the combined matrix utilizes CSEs in another encoding matrix in the combined matrix. When a space of the smallest encoding matrix in the combined matrix can be accommodated in a portion of a space of 0 formed adjacent to other encoding matrices, the smallest encoding matrix is relocated to the space of 0 with two sides adjacent to one encoding matrix, respectively. Two adjacent encoding matrices may be separated by a number of 0.

According to another aspect of the present invention, an encoder for encoding multi-modes of BCH codes has: a combined matrix unit, for providing a plurality of encoding matrices for multiplying elements thereof with one input data having p bits, and outputting the results as a calculated data in a first clock cycle; a linear feedback shift register (LFSR), for linearly shifting the calculated data as an output data, and outputting the output data in a second clock cycle; and an adder, for receiving the output data and a divided processing data having p bits, adding the output data and the divided processing data, and outputting the sum as another input data to the combined matrix unit in the second clock cycle. An n-bit initial processing data including a k-bit message and being divided per p bits is sequentially inputted to the adder as the divided processing data; an encoded codeword is obtained in [n/p] clock cycles.

The encoding matrices with one side aligned form a combined matrix in the combined matrix unit, and the combined matrix unit processes multiplying using elements in one encoding matrix or one encoding matrix with common sub-expressions (CSEs) in another encoding matrix according to corresponding BCH codes. Each of the encoding matrices has a form of $$F^p = \left[ F^{p-1} \times \begin{bmatrix} g'_{R-1} \\ g'_{R-2} \\ \vdots \\ g'_1 \\ g'_0 \end{bmatrix} \quad \text{first } R-1 \text{ columns of } F^{p-1} \right], \text{ where}$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix},$$

For an n-bit initial processing data including a k-bit message and being divided per p bits, R is defined as R=n−k+1. $g'_{R-1}$, $g'_{R-2}$, . . . and $g'_0$ are coefficients of a generating polynomial, $g(x)=x^R+g'_{R-1}x^{R-1}+g'_{R-2}x^{R-2}+ \ldots +g'_2x^2+g'_1x^1+g'_0$. Any two encoding matrices have the same or different values of n and/or k. The combined matrix unit further has a logic operation portion to processes the multiplying.

DETAILED DESCRIPTION OF THE PREFERRED EMBODIMENTS

The present invention will now be described more specifically with reference to the following embodiments.

Figure 1:
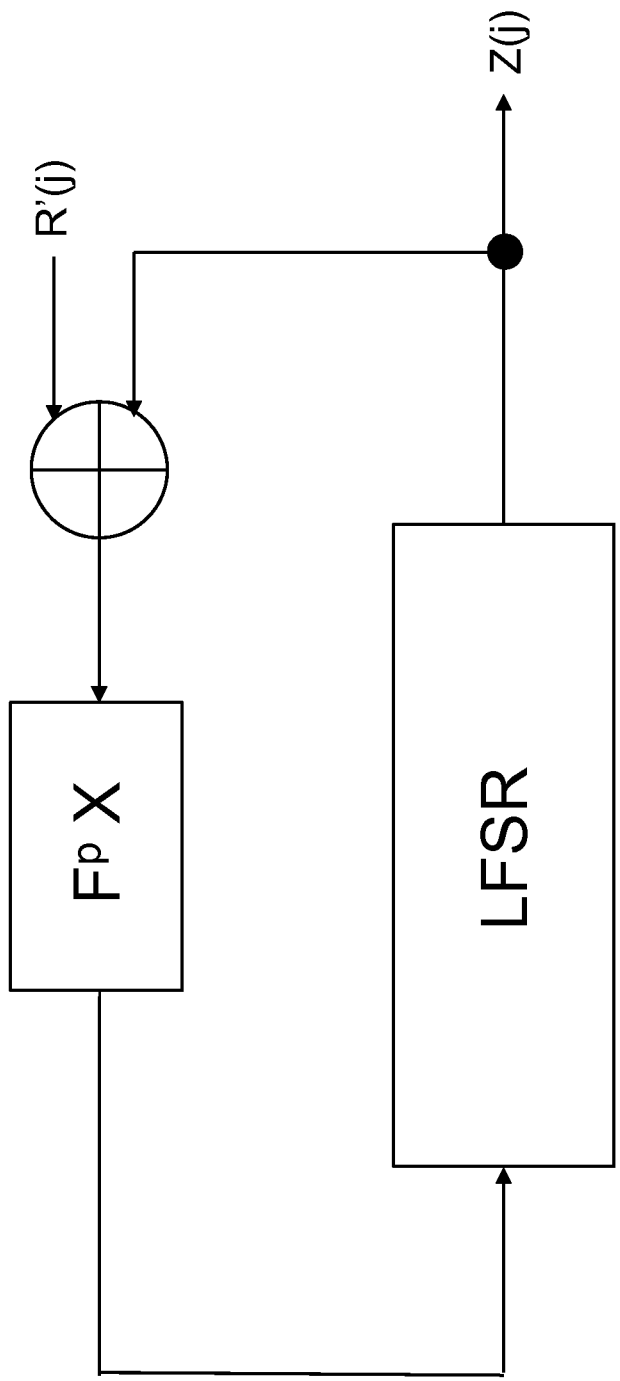
FIG. 1 is a conventional encoder for a BCH code.
Figure 2:
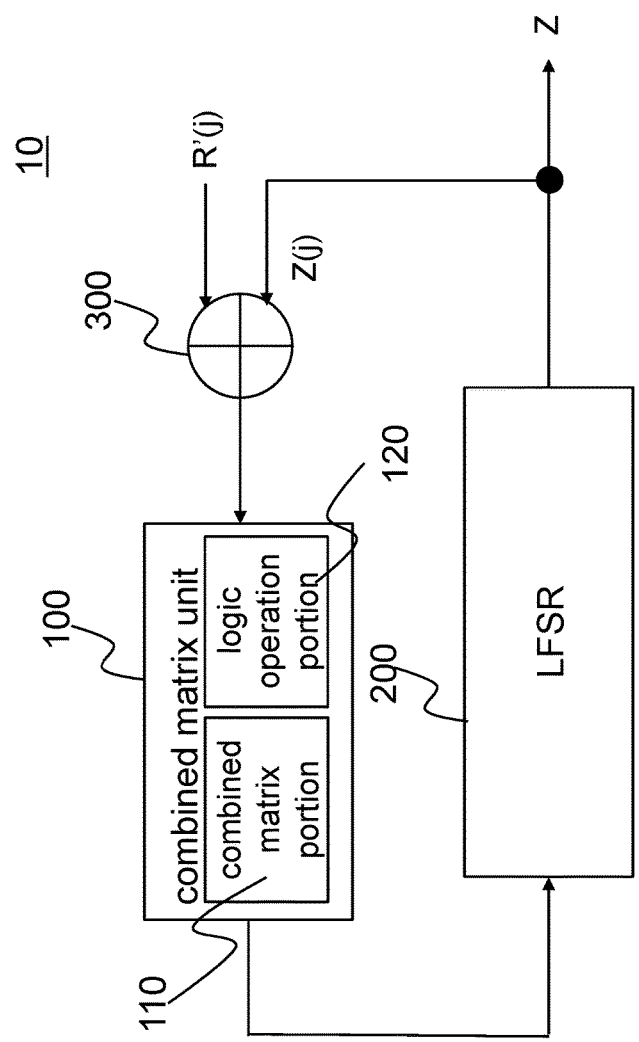
FIG. 2 is an encoder for encoding multi-mode BCH codes according to the present invention.
Figure 3:
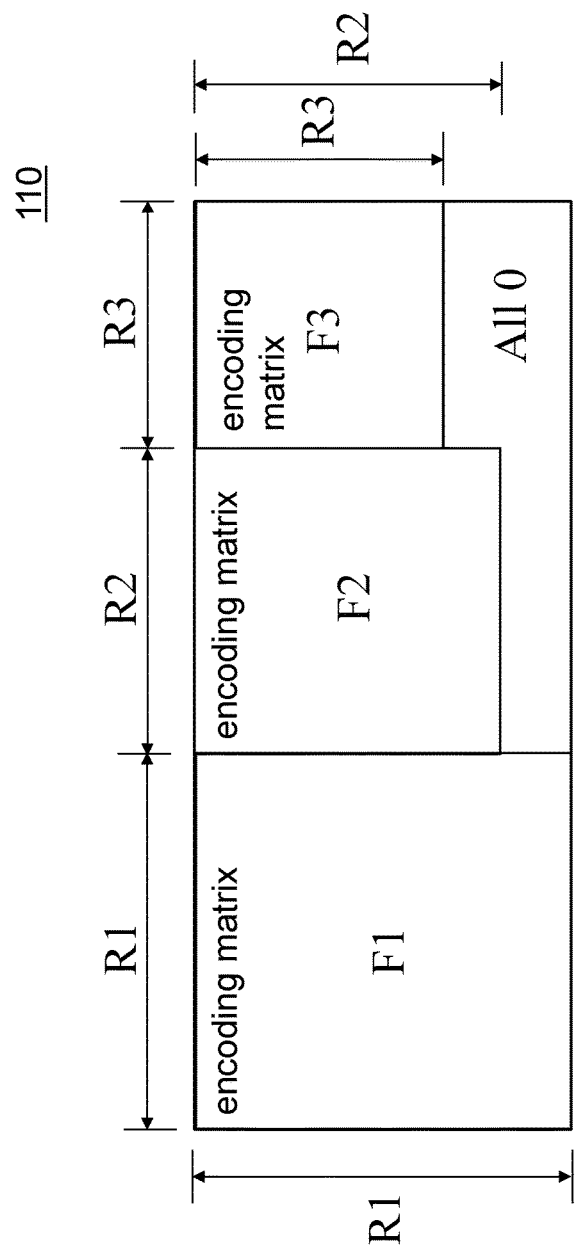
FIG. 3 shows a structure of a combined matrix portion used in one embodiment.
Figure 4:
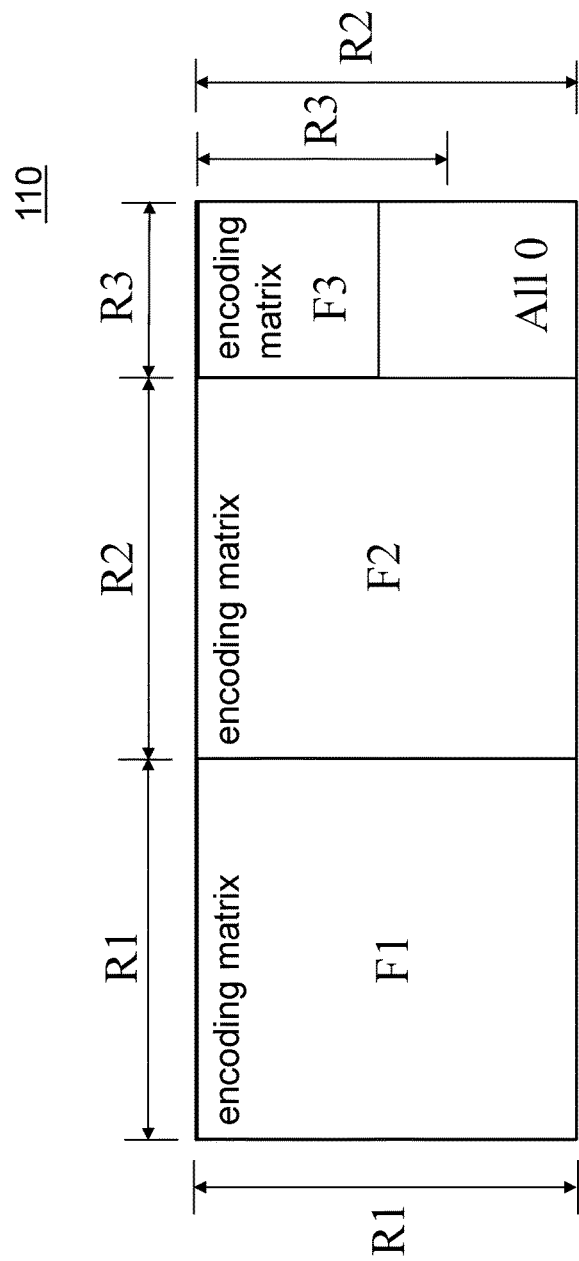
FIG. 4 shows a structure of a combined matrix portion used in another embodiment.

Please refer to FIG. 2 to FIG. 4. An embodiment according to the present invention is illustrated. An encoder 10 used for encoding multi-modes of BCH codes includes a combined matrix unit 100, a linear feedback shift register (LFSR) 200 and an adder 300. Each mode of BCH codes may have different code rate, code length or numerical m in GF($2^m$). A combination of any number of modes implemented by the encoder 10 is possible.

The combined matrix unit 100 is used to provide a number of encoding matrices for multiplying elements in one encoding matrix or in one encoding matrix with common sub-expressions (CSEs) in another encoding matrix with one input data which has p bits. It can further output the results as a calculated data in a first clock cycle. The encoding matrices with one side aligned form a combined matrix in the combined matrix unit 100. The combined matrix unit 100 processes multiplying according to corresponding BCH codes. The combined matrix is stored in a combined matrix portion 110. In order to have a better understanding of the combined matrix portion 110, please refer to FIG. 3.

FIG. 3 shows a structure of the combined matrix portion 110 used in one embodiment. It should be noticed that the combined matrix portion 110 can be any kind of electronic component, for example, an array of Read-Only Memories (ROM) to keep the elements (0 and 1) of the encoding matrices. In FIG. 3, three squares are used to denote three encoding matrices, respectively. Total area of the combined matrix portion 110 in the combined matrix unit 100 is presented by R1×(R1+R2+R3). Each sub-area of F1 (encoding matrix 1 with side length of R1), F2 (encoding matrix 2 with side length of R2) and F3 (encoding matrix 3 with side length of R3) are used to describe the relative locations where encoding matrices are located in the combined matrix portion 110. Elements of each encoding matrix are arranged in corresponding sub-area.

Space in the combined matrix which is not filled by elements of the encoding matrices is filled with 0 as shown in FIG. 3. Preferably, one side of the combined matrix has encoding matrices arranged in sequence. Preferably, it is arranged from a largest one to a smallest one in sequence. Of course, others sequences, such as from a smaller one to a largest one, or inserting the smaller one between two larger ones, are possible. It is on the top side of the combined matrix with R1, R2 and R3 arranged from the left to the right. One point is that the other side of the combined matrix should be equal to the side length of the largest encoding matrix, R1. It is the way to keep the area of the combined matrix smaller (saving area cost) and reduce waste of space.

According to the present invention, each of the encoding matrices can be used to multiply with a p-bit input data and then output the results. An n-bit initial processing data including a k-bit message and being divided per p bits is sequentially inputted to the adder as the divided processing data. The processes are the same as that described in the BACKGROUND OF THE INVENTION. It is not necessary to repeat it again. Thus, each of the encoding matrices has a form of $$F^p = \left[ F^{p-1} \times \begin{bmatrix} g'_{R-1} \\ g'_{R-2} \\ \vdots \\ g'_1 \\ g'_0 \end{bmatrix} \quad \text{first } R-1 \text{ columns of } F^{p-1} \right], \text{where}$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix}.$$

R is defined as R=n−k+1; $g'_{R-1}$, $g'_{R-2}$, ... and $g'_0$ are coefficients of a generating polynomial, $g(x)=x^R+g'_{R-1}x^{R-1}+g'_{R-2}x^{R-2}+\ldots+g'_2x^2+g'_1x^1+g'_0$. It is appreciated that any two encoding matrices may have the same or different values of n and/or k. It means the encoded codewords from each encoding matrix can have different code rate, code length or numerical m in $GF(2^m)$. In other words, the combined matrix is able to provide BCH codes with different modes as it is designed.

The combined matrix unit 100 further has a logic operation portion 120 to process the multiplying. According to the spirit of the present invention, some CSEs in two or more encoding matrices can be found out and utilized. For example, if F1 and F2 have CSEs, calculations of the multiplying for two different BCH codes can utilize the same CSEs in F1 by the logic operation portion 120. Namely, at least one encoding matrix in the combined matrix utilizes CSEs in another encoding matrix in the combined matrix. Thus, further multiplexers should be avoided to use in the LFSR 200. The advantages of such design are to avoid additional area and delay time due to insertions of the multiplexers. According to the present invention, there can be other encoding matrix which doesn't have CSEs, for example, F3. It is not necessary for all encoding matrices to have CSEs.

Like LFSRs wildly used, the LFSR 200 is able to linearly shift the calculated data as an output data, and then output the output data in a second clock cycle. The adder 300 receives the output data (shown by Z(j) in FIG. 2) and a divided processing data (shown by R'(j) in FIG. 2) having p bits from the initial processing data, adds the output data and the divided processing data, and outputs the sum as another input data to the combined matrix unit in the second clock cycle. The second clock is one clock cycle later than the first clock cycle. The input data from the adder 300 is again inputted to the combined matrix unit 100 for a calculation in the second clock cycle. An encoded codeword Z (shown in FIG. 2) can be obtained in the [n/p] clock cycles.

In another embodiment, the two encoding matrices may have the same size of space. Please refer to FIG. 4. F1 and F2 in FIG. 4 have the same size of space but not functionally identical. According to the spirit of the present invention, the arrangement of encoding matrices is to put two same-sized matrices together, e.g. F1 and F2. Then, a smaller F3 is arranged next to F2. The rest portions of the combined matrix can be filled with 0.

Figure 5:
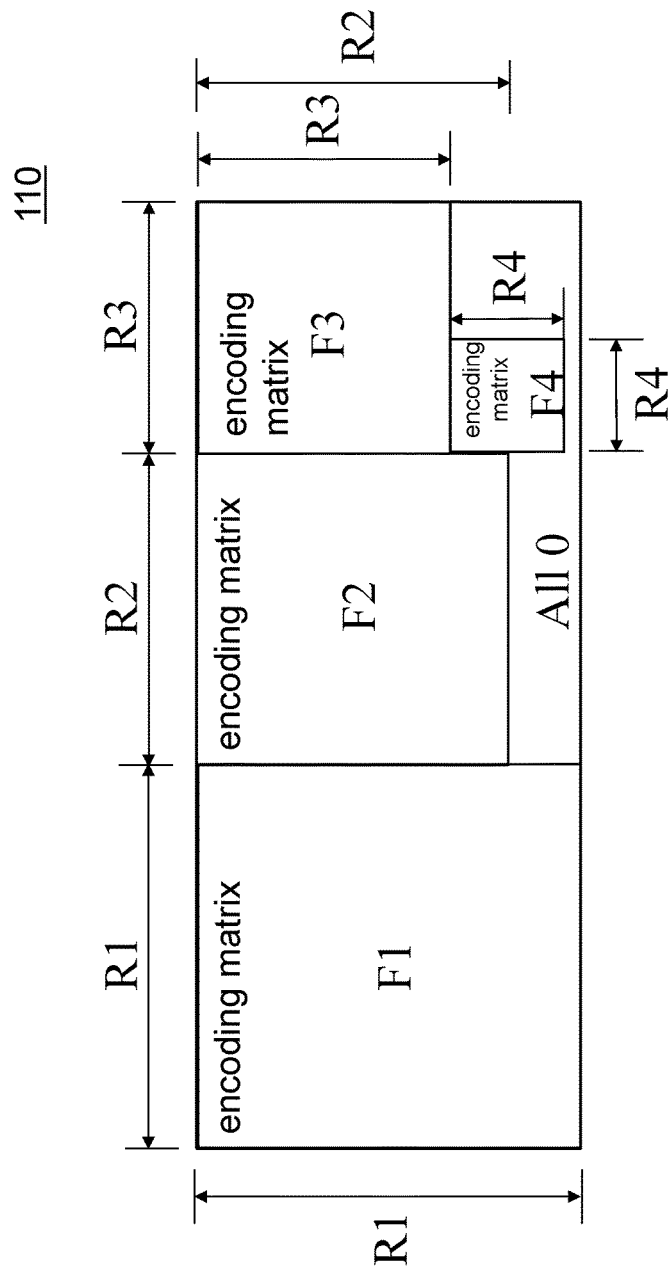
FIG. 5 shows a structure of a combined matrix portion used in still another embodiment.

Of course, the number of encoding matrices is not limited to 3. It can be any number greater than or equal to 2. In FIG. 5, four encoding matrices (F1, F2, F3 and F4) are applied. A space of the smallest encoding matrix (F4) in the combined matrix unit 110 can be accommodated in a portion of a space of 0 formed adjacent to other encoding matrices (F2 and F3). The smallest encoding matrix (F4) is located to the space of 0 with two sides adjacent to encoding matrices (F2 and F3), respectively. F4 doesn't have to be arranged on the top side of the combined matrix next to F3.

Figure 6:
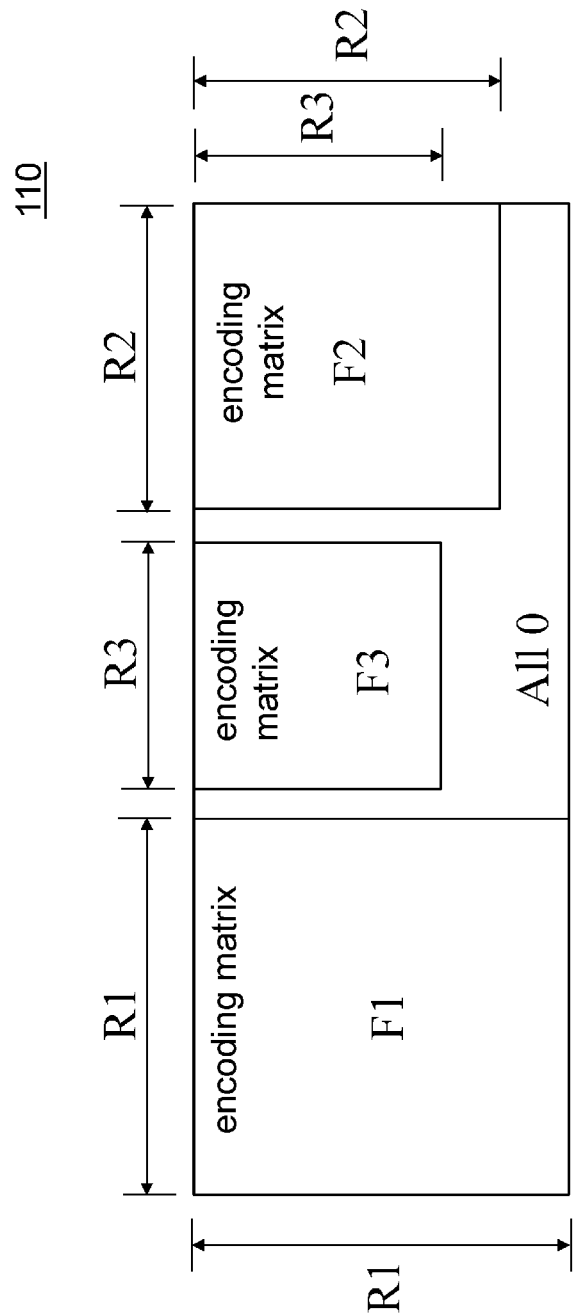
FIG. 6 shows a structure of a combined matrix portion used in still another embodiment.

From the designer's point of view, it may be possible to add zeros (0) between two adjacent encoding matrices to identify each encoding matrix so that de-bug could be easier. Under this situation, two adjacent encoding matrices are separated by a number of 0. Please see FIG. 6. As mentioned above, the embodiment of FIG. 6 is illustrated by arranging F3 between F1 and F2. Namely, the smallest encoding matrix is arranged between two larger matrices. It is another arrangement and different from other embodiments.

Figure 7:
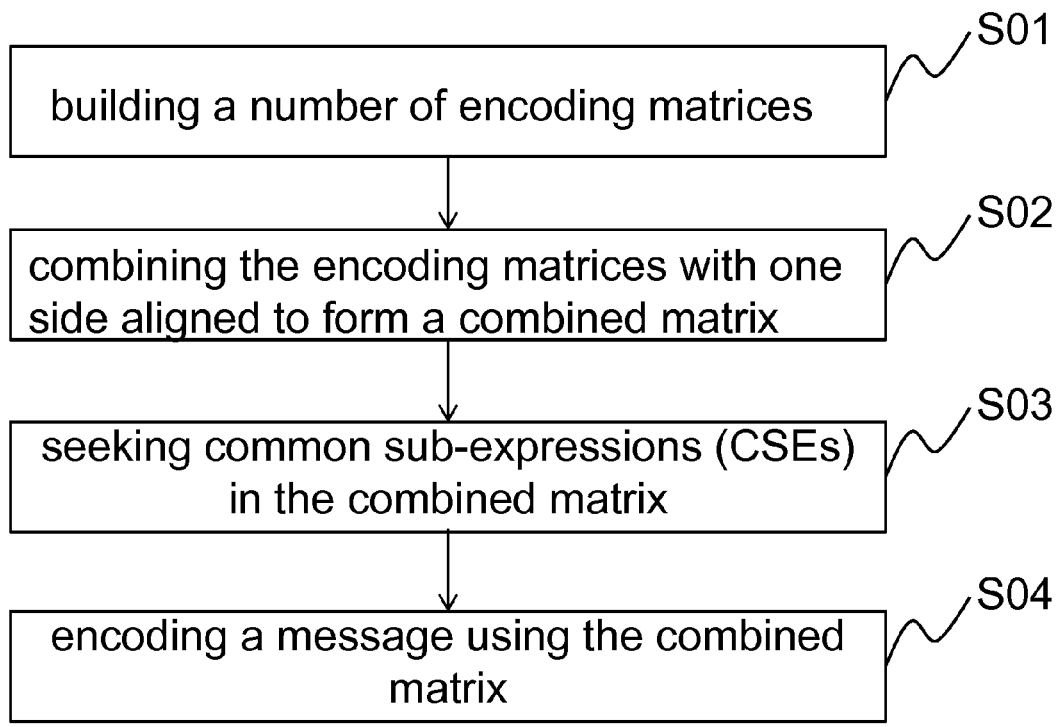
FIG. 7 is a flow chart of an encoding method according to the present invention.

From the description above, a method for encoding multi-modes of BCH codes can be found. Please refer to FIG. 7. The method has the step of: building a number of encoding matrices (S01); combining the encoding matrices with one side aligned to form a combined matrix (S02); seeking common sub-expressions (CSEs) in the combined matrix (S03), and encoding a message using the combined matrix (S04). Each of the encoding matrix should have a form of $$F^p = \left[ F^{p-1} \times \begin{bmatrix} g'_{R-1} \\ g'_{R-2} \\ \vdots \\ g'_1 \\ g'_0 \end{bmatrix} \quad \text{first } R-1 \text{ columns of } F^{p-1} \right], \text{where}$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix}.$$

Definitions of n, k, R, $g'_{R-1}$, $g'_{R-2}$, ... and $g'_0$ have been illustrated above. Space in the combined matrix not filled by elements of the encoding matrices are filled with 0. One side of the combined matrix has encoding matrices arranged in sequence. At least one encoding matrix in the combined matrix utilizes CSEs in another encoding matrix in the combined matrix. When a space of the smallest encoding matrix in the combined matrix can be accommodated in a portion of a space of 0 formed adjacent to other encoding matrices, the smallest encoding matrix is located to the space of 0 with two sides adjacent to one encoding matrix, respectively. Two adjacent encoding matrices may be separated by a plurality of 0.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An encoder for encoding BCH codes of different modes, comprising:
   a combined matrix unit, for providing a plurality of encoding matrices for multiplying elements from the encoding matrices with one input data having p bits, and outputting the results as a calculated data in a first clock cycle;

a linear feedback shift register (LFSR), for linearly shifting the calculated data as an output data, and outputting the output data in a second clock cycle; and an adder, for adding the output data received from the LFSR and a divided processing data having p bits, and outputting the sum as another input data to the combined matrix unit in the second clock cycle, wherein an n-bit initial processing data including a k-bit message and being divided per p bits is sequentially inputted to the adder as the divided processing data; an encoded codeword is obtained in [n/p] clock cycles; the second clock cycle is one clock cycle later than the first clock cycle.

2. The encoder according to claim 1, wherein the encoding matrices with one side aligned form a combined matrix in the combined matrix unit, and the combined matrix unit processes multiplying using elements in one encoding matrix or one encoding matrix with common sub-expressions (CSEs) in another encoding matrix according to corresponding BCH codes.

3. The encoder according to claim 2, wherein each of the encoding matrices has a form of $$F^p = \left[ F^{p-1} \times \begin{bmatrix} g'_{R-1} \\ g'_{R-2} \\ \vdots \\ g'_1 \\ g'_0 \end{bmatrix} \middle| \text{first } R-1 \text{ columns of } F^{p-1} \right], \text{ where}$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix},$$

wherein for an n-bit initial processing data including a k-bit message and being divided per p bits, R is defined as $R=n-k+1$; $g'_{R-1}$, $g'_{R-2}$, ... and $g'_0$ are coefficients of a generating polynomial, $g(x)=x^R+g'_{R-1}x^{R-1}+g'_{R-2}x^{R-2}+\ldots+g'_2x^2+g'_1x^1+g'_0$; any two encoding matrices have the same or different values of n and/or k.

4. The encoder according to claim 2, wherein the combined matrix unit further has a logic operation portion to processes the multiplying.

5. The encoder according to claim 1, wherein space in the combined matrix which is not filled by elements of the encoding matrices is filled with 0.

6. The encoder according to claim 1, wherein one side of the combined matrix has encoding matrices arranged in sequence.

7. The encoder according to claim 1, wherein at least one encoding matrix in the combined matrix utilizes CSEs in another encoding matrix in the combined matrix.

8. The encoder according to claim 1, wherein when a space of the smallest encoding matrix in the combined matrix can be accommodated in a portion of a space of 0 formed adjacent to other encoding matrices, the smallest encoding matrix is located to the space of 0 with two sides adjacent to one encoding matrix, respectively.

9. The encoder according to claim 1, wherein two adjacent encoding matrices are separated by a plurality of 0.

10. A method for encoding BCH codes of different modes by the encoder according to claim 1, comprising the steps of:

building a plurality of encoding matrices by the combined matrix unit;

combining the plurality of encoding matrices to form a combined matrix by aligning the plurality of encoding matrices side by side to each other;

seeking common sub-expressions (CSEs) in the combined matrix, and encoding a message using the combined matrix, wherein each of the encoding matrix has a form of $$F^p = \left[ F^{p-1} \times \begin{bmatrix} g'_{R-1} \\ g'_{R-2} \\ \vdots \\ g'_1 \\ g'_0 \end{bmatrix} \middle| \text{first } R-1 \text{ columns of } F^{p-1} \right], \text{ where}$$

$$F^1 = \begin{bmatrix} g'_{R-1} & 1 & 0 & \cdots & 0 \\ g'_{R-2} & 0 & 1 & \cdots & 0 \\ \vdots & \vdots & \vdots & \vdots & \vdots \\ g'_1 & 0 & 0 & \cdots & 1 \\ g'_0 & 0 & 0 & \cdots & 0 \end{bmatrix},$$

wherein for an n-bit initial processing data including a k-bit message and being divided per p bits, R is defined as $R=n-k+1$;

wherein $g'_{R-1}$, $g'_{R-2}$, ... and $g'_0$ are coefficients of a generating polynomial, $g(x)=x^R+g'_{R-1}x^{R-1}+g'_{R-2}x^{R-2}+\ldots+g'_2x^2+g'_1x^1+g'_0$;

wherein any two encoding matrices have the same or different values of n and/or k; and wherein F is an encoding matrix, p is the amount of data that can be processed in a clock cycle, and R is an equation of the form $R=n-k+1$, where n is the length of the initial processing data and k is the length of the message; and wherein n and p are positive integers, and $1<n<p$.

* * * * *